United States Patent
Yao et al.

(10) Patent No.: US 11,462,618 B2
(45) Date of Patent: Oct. 4, 2022

(54) SEMICONDUCTOR DEVICE WITH REDUCED FLOATING BODY EFFECTS AND FABRICATION METHOD THEREOF

(71) Applicant: UNITED MICROELECTRONICS CORP., Hsin-Chu (TW)

(72) Inventors: Hai Biao Yao, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/191,720

(22) Filed: Mar. 4, 2021

(65) Prior Publication Data

US 2021/0210605 A1 Jul. 8, 2021

Related U.S. Application Data

(62) Division of application No. 16/223,133, filed on Dec. 18, 2018, now abandoned.

(51) Int. Cl.
| | |
|---|---|
| *H01L 29/10* | (2006.01) |
| *H01L 29/78* | (2006.01) |
| *H01L 29/06* | (2006.01) |
| *H01L 29/08* | (2006.01) |
| *H01L 29/36* | (2006.01) |
| *H01L 29/66* | (2006.01) |
| H01L 21/266 | (2006.01) |
| H01L 21/265 | (2006.01) |
| H01L 29/167 | (2006.01) |

(52) U.S. Cl.
CPC ...... *H01L 29/1095* (2013.01); *H01L 29/0649* (2013.01); *H01L 29/0847* (2013.01); *H01L 29/1033* (2013.01); *H01L 29/36* (2013.01); *H01L 29/66568* (2013.01); *H01L 29/7841* (2013.01); *H01L 21/266* (2013.01); *H01L 21/26513* (2013.01); *H01L 29/167* (2013.01)

(58) Field of Classification Search
CPC ............ H01L 29/7841; H01L 29/0649; H01L 29/66537
See application file for complete search history.

(56) References Cited

U.S. PATENT DOCUMENTS

| | | | | |
|---|---|---|---|---|
| 4,959,697 A | * | 9/1990 | Shier | ................. H01L 29/66901 257/287 |
| 6,218,714 B1 | * | 4/2001 | Yamazaki | ........... H01L 29/0607 257/E29.007 |
| 6,225,192 B1 | | 5/2001 | Aspar | |
| 6,248,652 B1 | * | 6/2001 | Kokubun | .......... H01L 29/66537 438/585 |
| 6,720,238 B2 | | 4/2004 | Dietrich | |
| 7,122,867 B2 | | 10/2006 | Liou | |

(Continued)

*Primary Examiner* — Tuan A Hoang
(74) *Attorney, Agent, or Firm* — Winston Hsu

(57) ABSTRACT

An SOI semiconductor device includes a substrate, a buried oxide layer disposed on the substrate, a top semiconductor layer disposed on the buried oxide layer, a source doping region and a drain doping region in the top semiconductor layer, a channel region between the source doping region and the drain doping region in the top semiconductor layer, a gate electrode on the channel region, and an embedded doping region disposed in the top semiconductor layer and directly under the channel region. The embedded doping region acts as a hole sink to alleviate or avoid floating body effects.

16 Claims, 2 Drawing Sheets

(56) References Cited

U.S. PATENT DOCUMENTS

| | | | |
|---|---|---|---|
| 7,375,408 B2 | 5/2008 | Lee | |
| 7,646,043 B2 | 1/2010 | Sriram | |
| 8,574,929 B1* | 11/2013 | Or-Bach | H01L 21/76254 |
| | | | 438/795 |
| 8,592,905 B2 | 11/2013 | Pu | |
| 8,847,310 B1 | 9/2014 | Korec | |
| 2004/0132254 A1* | 7/2004 | Herr | H01L 21/221 |
| | | | 257/E29.082 |
| 2014/0084385 A1 | 3/2014 | Hoffmann | |
| 2014/0353740 A1 | 12/2014 | Nishida | |
| 2015/0221651 A1* | 8/2015 | Toh | H01L 29/7841 |
| | | | 438/151 |
| 2017/0062624 A1* | 3/2017 | Makiyama | H01L 27/11573 |

* cited by examiner

SEMICONDUCTOR DEVICE WITH REDUCED FLOATING BODY EFFECTS AND FABRICATION METHOD THEREOF

CROSS REFERENCE TO RELATED APPLICATIONS

This application is a division of U.S. application Ser. No. 16/223,133 filed Dec. 18, 2018, the subject matter of which is hereby incorporated by reference.

BACKGROUND OF THE INVENTION

1. Field of the Invention

The present disclosure relates generally to the field of semiconductor technology. More particularly, the present disclosure relates to a silicon-on-insulator (SOI) semiconductor device with reduced floating body effects and methods for fabricating the same.

2. Description of the Prior Art

Many MOSFET devices today are fabricated on Semiconductor-On-Insulator (SOI) wafers rather than on bulk substrates. SOI wafers feature a thin semiconductor layer which is disposed over an oxide dielectric layer. Transistors fabricated on such wafers offer the potential of superior performance characteristics due to the thin film nature of the semiconductor substrate and the electrically insulating properties of the underlying dielectric layer. Hence, compared to analogous bulk devices, SOI MOSFETs may manifest superior short channel performance, near-ideal subthreshold voltage swings (which results in low off-state current leakage), and high saturation current.

One challenge is the floating-body effect, a phenomenon manifested as a decrease in voltage between the source and the drain regions. This effect is especially problematic for partially depleted SOI MOSFETs of the type currently used in some memory devices. Accordingly, it would be desirable to reduce the adverse effects of the floating body of SOI devices. The floating-body effects are normally more severe in NMOS devices than in PMOS devices, due to a higher impact ionization rate and normally higher parasitic bipolar gain.

SUMMARY OF THE INVENTION

It is one object of the present disclosure to provide an improved silicon-on-insulator (SOI) semiconductor device capable of reducing the floating body effects.

According to one aspect of the present disclosure, a semiconductor device with reduced floating body effects is provided. The semiconductor device includes a substrate, a buried oxide layer disposed on the substrate, a top semiconductor layer of a first conductivity type disposed on the buried oxide layer, a source doping region of a second conductivity type in the top semiconductor layer, a drain doping region of the second conductivity type in the top semiconductor layer, a channel region between the source doping region and the drain doping region in the top semiconductor layer, a gate electrode on the channel region, and an embedded region of the first conductivity type disposed in the top semiconductor layer and directly under the channel region. The embedded region acts as a hole sink to alleviate or avoid floating body effects.

According to one embodiment of the invention, the channel region is disposed within an ion well of the first conductivity type. According to one embodiment of the invention, the embedded region of the first conductivity type is disposed at a bottom of the ion well of the first conductivity type.

According to one embodiment of the invention, the embedded region of the first conductivity type is adjoined to an upper surface of the buried oxide layer.

According to one embodiment of the invention, the embedded region of the first conductivity type has a doping concentration that is greater than that of the ion well of the first conductivity type. For example, the doping concentration of the embedded region of the first conductivity type ranges between 1E15 and 1E16 atoms/cm$^3$, and the doping concentration of the ion well of the first conductivity type ranges between 1E13 and 1E15 atoms/cm$^3$.

According to one embodiment of the invention, the embedded region of the first conductivity type has a thickness that is smaller than or equal to one third of a thickness of the top semiconductor layer.

According to one embodiment of the invention, the embedded region of the first conductivity type is contiguous with the source doping region and the drain doping region.

According to another embodiment of the invention, the embedded region of the first conductivity type is spaced apart from the source doping region and the drain doping region.

According to one aspect of the present disclosure, a method for forming a semiconductor structure is provided. A silicon-on-insulator (SOI) substrate including a substrate, a buried oxide layer disposed on the substrate, and a top semiconductor layer of a first conductivity type disposed on the buried oxide layer is prepared. An embedded region of the first conductivity type is formed in the top semiconductor layer. A gate electrode is then formed on the top semiconductor layer. A source doping region of a second conductivity type and a drain doping region of the second conductivity type are formed in the top semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Therefore, the following detailed description is not to be considered as limiting, but the embodiments included herein are defined by the scope of the accompanying claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Figure 1:
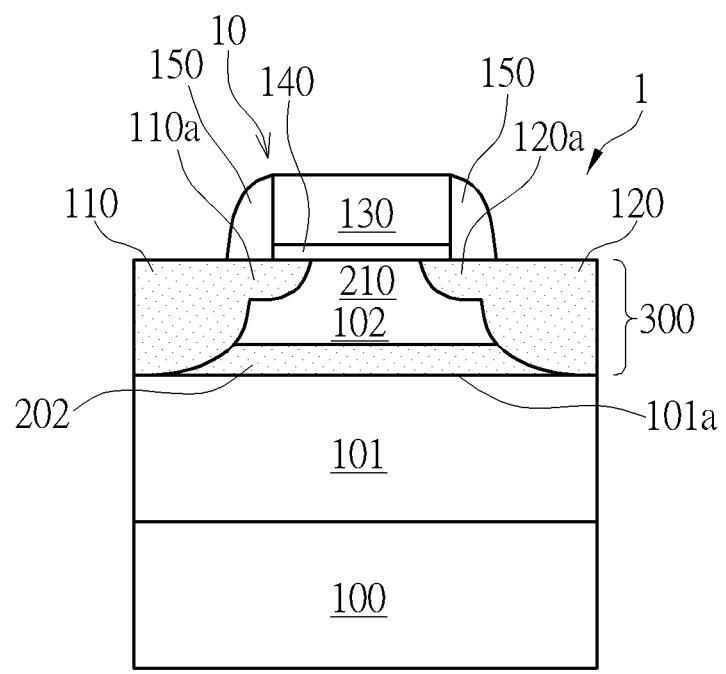
FIG. 1 is a schematic, cross-sectional diagram showing a silicon-on-insulator (SOI) semiconductor device capable of reducing the floating body effects in accordance with one embodiment of the invention.

Please refer to FIG. 1. FIG. 1 is a schematic, cross-sectional diagram showing a silicon-on-insulator (SOI) semiconductor device capable of reducing the floating body effects in accordance with one embodiment of the invention. As shown in FIG. 1, the SOI semiconductor device 1 comprises a substrate 100, a buried oxide layer 101 disposed on the substrate 100, and a top semiconductor layer 102 of a first conductivity type such as P type disposed on the buried oxide layer 101.

For example, the substrate 100 may comprise a handle wafer, but is not limited thereto. For example, the buried oxide layer 101 may comprise silicon oxide, but is not limited thereto. For example, the top semiconductor layer 102 of a first conductivity type may comprise silicon or epitaxial silicon, but is not limited thereto. For example, the semiconductor device 1 is a partially depleted SOI MOSFET device.

According to one embodiment of the invention, a semiconductor transistor 10 may be formed on the top semiconductor layer 102. The semiconductor transistor 10 may comprise a source doping region 110 of a second conductivity type such as N type in the top semiconductor layer 102, a drain doping region 120 of the second conductivity type such as N type in the top semiconductor layer 102, a channel region 210 between the source doping region 110 and the drain doping region 120 in the top semiconductor layer 102, and a gate electrode 130 overlying the channel region 210 between the source doping region 110 and the drain doping region 120.

According to one embodiment of the invention, a gate dielectric layer 140 is disposed between the gate electrode 130 and the channel region 210. A pair of spacers 150 may be formed adjacent to the sidewalls of the gate electrode 130. According to one embodiment of the invention, the source doping region 110 of a second conductivity type may comprise a lightly doped drain (LDD) region 110a that is in proximity to the channel region 210. According to one embodiment of the invention, the drain doping region 120 of a second conductivity type may comprise a lightly doped drain (LDD) region 120a in proximity to the channel region 210.

According to one embodiment of the invention, an embedded region 202 of the first conductivity type such as P type is disposed in the top semiconductor layer 102 and is directly under the channel region 210. According to one embodiment of the invention, the embedded region 202 of the first conductivity type is contiguous with the source doping region 110 and the drain doping region 120.

According to one embodiment of the invention, the channel region 210 is disposed within an ion well 300 of the first conductivity type. For example, the ion well 300 of the first conductivity type is P well. According to one embodiment of the invention, the embedded region 202 of the first conductivity type is disposed at a bottom of the ion well of the first conductivity type.

According to one embodiment of the invention, the embedded region 202 of the first conductivity type is adjoined to an upper surface 101a of the buried oxide layer 101.

According to one embodiment of the invention, the embedded region 202 of the first conductivity type has a doping concentration that is greater than that of the ion well 300 of the first conductivity type. For example, the doping concentration of the embedded region 202 of the first conductivity type may range between 1E15 and 1E16 atoms/cm$^3$, and the doping concentration of the ion well 300 of the first conductivity type may range between 1E13 and 1E15 atoms/cm$^3$.

According to one embodiment of the invention, the embedded region 202 of the first conductivity type has a thickness that is smaller than or equal to one third of a thickness of the top semiconductor layer 102.

It is advantageous to use the present invention because the embedded region 202 of the first conductivity type is a heavily P type doped region situated directly below the channel region 210, which acts as a hole sink to alleviate or avoid floating body effects during the operation of the semiconductor transistor 10.

Figure 2:
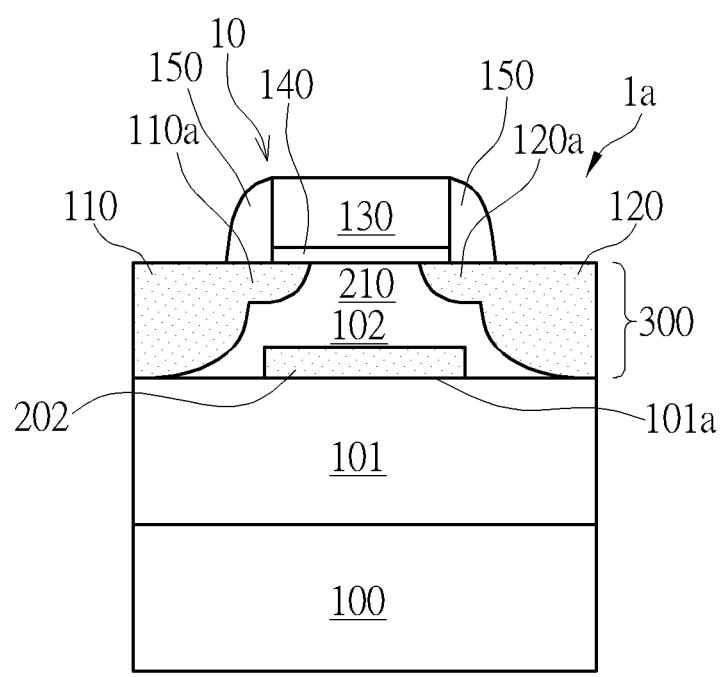
FIG. 2 is a schematic, cross-sectional diagram showing a silicon-on-insulator (SOI) semiconductor device capable of reducing the floating body effects in accordance with another embodiment of the invention.

FIG. 2 is a schematic, cross-sectional diagram showing a silicon-on-insulator (SOI) semiconductor device capable of reducing the floating body effects in accordance with another embodiment of the invention, wherein like numeral numbers designate like layers, materials, regions, or elements. As shown in FIG. 2, likewise, the SOI semiconductor device 1a comprises a substrate 100, a buried oxide layer 101 disposed on the substrate 100, and a top semiconductor layer 102 of a first conductivity type such as P type disposed on the buried oxide layer 101.

A semiconductor transistor 10 may be formed on the top semiconductor layer 102. The semiconductor transistor 10 may comprise a source doping region 110 of a second conductivity type such as N type in the top semiconductor layer 102, a drain doping region 120 of the second conductivity type such as N type in the top semiconductor layer 102, a channel region 210 between the source doping region 110 and the drain doping region 120 in the top semiconductor layer 102, and a gate electrode 130 overlying the channel region 210 between the source doping region 110 and the drain doping region 120.

The only difference between the SOI semiconductor device in FIG. 1 and the SOI semiconductor device 1a in FIG. 2 is that the embedded region of the first conductivity type of the SOI semiconductor device 1a is spaced apart from the source doping region 110 and the drain doping region 120. That is, the embedded region 202 of the first conductivity type is not contiguous with the source doping region 110 and the drain doping region 120.

Figure 3:
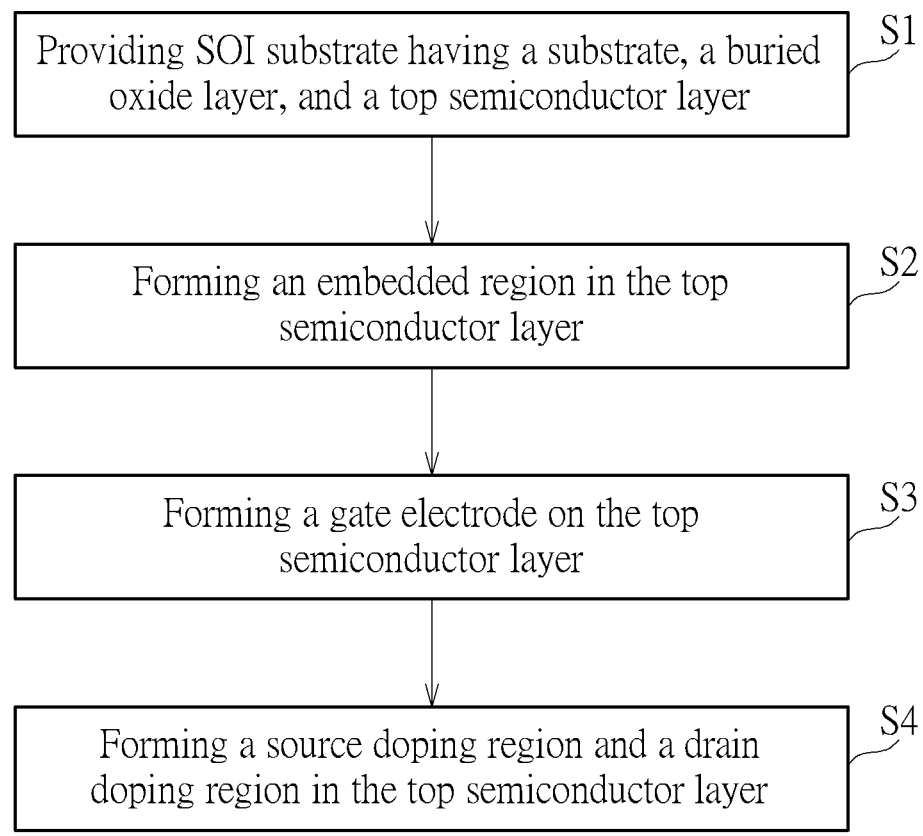
FIG. 3 is a flowchart showing an exemplary method for fabricating the SOI semiconductor device in accordance with embodiments of the invention.

Please refer to FIG. 3, and briefly to FIG. 1. FIG. 3 is a flowchart showing an exemplary method for fabricating the SOI semiconductor device in FIG. 1 or FIG. 2 in accordance with embodiments of the invention. As shown in FIG. 3, the method starts with Step S1. In Step S1, a silicon-on-insulator (SOI) substrate (e.g., the SOI substrate consisting layers 100, 101 and 102 in FIG. 1) comprising a substrate (e.g., layer 100 in FIG. 1), a buried oxide layer (e.g., layer 101 in FIG. 1) disposed on the substrate, and a top semiconductor layer (e.g., layer 102 in FIG. 1) of a first conductivity type disposed on the buried oxide layer is prepared.

In Step S2, an embedded region (e.g., region 202 in FIG. 1) of the first conductivity type is formed in the top semiconductor layer. To form the embedded region of the first conductivity type in the top semiconductor layer, a lithographic process and an ion implantation process may be performed. For example, a photoresist pattern may be formed on a top surface of the SOI substrate. The photoresist pattern has an opening corresponding to the channel region of the semiconductor transistor to be formed in the top semiconductor layer. Dopants of the first conductivity type such as boron ions are then implanted into the top semiconductor layer to a predetermined depth and concentration. The photoresist pattern is then stripped.

According to some embodiments, it is to be understood that the above-mentioned lithographic process and ion implantation process may be performed during the fabrication or preparation of the SOI substrate. For example, the above-mentioned lithographic process and an ion implantation process may be performed before bonding with a handle wafer.

In Step S3, a gate electrode (e.g., gate electrode 130 in FIG. 1) is then formed on the top semiconductor layer. To form the gate electrode, a conductive layer such as a polysilicon layer and/or a metal layer is first deposited onto the top surface of the SOI substrate. The conductive layer may be deposited by using any suitable methods known in the art, for example, chemical vapor deposition (CVD), atomic layer deposition (ALD) or physical vapor deposition (PVD). A lithographic process and an etching process may be performed to pattern the conductive layer.

According to some embodiments, a gate dielectric layer (e.g., layer 140 in FIG. 1) is disposed between the gate electrode and the channel region. A pair of spacers (e.g., spacers 150 in FIG. 1) may be formed adjacent to the sidewalls of the gate electrode.

In Step S4, after forming the gate electrode, an ion implantation process is performed to form a source doping region (e.g., region 110 in FIG. 1) of a second conductivity type and a drain doping region (e.g., region 120 in FIG. 1) of the second conductivity type in the top semiconductor layer, thereby forming the semiconductor transistor (e.g., transistor 10 in FIG. 1).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with reduced floating body effects, comprising:
   a substrate;
   a buried oxide layer disposed on the substrate;
   a top semiconductor layer of a first conductivity type disposed on the buried oxide layer;
   a source doping region of a second conductivity type in the top semiconductor layer;
   a first lightly doped drain (LDD) region adjacent to the source doping region;
   a drain doping region of the second conductivity type in the top semiconductor layer;
   a second lightly doped drain (LDD) region adjacent to the drain doping region;
   a channel region between the first LDD region and the second LDD region in the top semiconductor layer;
   a gate electrode on the channel region; and
   an embedded region of the first conductivity type disposed in the top semiconductor layer and directly under the channel region, wherein the embedded region of the first conductivity type is spaced apart from the first LDD region and the second LDD region, wherein a bottom surface of the embedded region is coplanar with a bottom surface of the source doping region and a bottom surface of the drain doping region, and wherein the embedded region has a length that is greater than or equal to the length of the gate electrode.

2. The semiconductor device with reduced floating body effects according to claim 1, wherein the channel region is disposed within an ion well of the first conductivity type.

3. The semiconductor device with reduced floating body effects according to claim 2, wherein the embedded region of the first conductivity type is disposed at a bottom of the ion well of the first conductivity type.

4. The semiconductor device with reduced floating body effects according to claim 3, wherein the embedded region of the first conductivity type is adjoined to an upper surface of the buried oxide layer.

5. The semiconductor device with reduced floating body effects according to claim 2, wherein the embedded region of the first conductivity type has a doping concentration that is greater than that of the ion well of the first conductivity type.

6. The semiconductor device with reduced floating body effects according to claim 5, wherein the doping concentration of the embedded region of the first conductivity type ranges between 1E15 and 1E16 atoms/cm$^3$, and the doping concentration of the ion well of the first conductivity type ranges between 1E13 and 1E15 atoms/cm$^3$.

7. The semiconductor device with reduced floating body effects according to claim 1, wherein the embedded region of the first conductivity type has a thickness that is smaller than or equal to one third of a thickness of the top semiconductor layer.

8. The semiconductor device with reduced floating body effects according to claim 1, wherein the first conductivity type is P type and the second conductivity type is N type.

9. A method for forming a semiconductor structure, comprising:
   providing a silicon-on-insulator (SOI) substrate comprising a substrate, a buried oxide layer disposed on the substrate, and a top semiconductor layer of a first conductivity type disposed on the buried oxide layer;
   forming an embedded region of the first conductivity type in the top semiconductor layer;
   forming a gate electrode on the top semiconductor layer;
   forming a source doping region of a second conductivity type and a drain doping region of the second conductivity type in the top semiconductor layer; and
   forming a first lightly doped drain (LDD) region adjacent to the source doping region and a second lightly doped drain (LDD) region adjacent to the drain doping region, wherein a channel region is defined between the first LDD region and the second LDD region in the top semiconductor layer, wherein the embedded region of the first conductivity type is spaced apart from the first LDD region and the second LDD region, wherein a bottom surface of the embedded region is coplanar with a bottom surface of the source doping region and a bottom surface of the drain doping region, and wherein the embedded region has a length that is greater than or equal to the length of the gate electrode.

10. The method according to claim 9, wherein the channel region is disposed within an ion well of the first conductivity type.

11. The method according to claim 10, wherein the embedded region of the first conductivity type is disposed at a bottom of the ion well of the first conductivity type.

12. The method according to claim 11, wherein the embedded region of the first conductivity type is adjoined to an upper surface of the buried oxide layer.

13. The method according to claim 10, wherein the embedded region of the first conductivity type has a doping concentration that is greater than that of the ion well of the first conductivity type.

14. The method according to claim 13, wherein the doping concentration of the embedded region of the first conductivity type ranges between 1E15 and 1E16 atoms/cm$^3$, and the doping concentration of the ion well of the first conductivity type ranges between 1E13 and 1E15 atoms/cm$^3$.

15. The method according to claim 9, wherein the embedded region of the first conductivity type has a thickness that is smaller than or equal to one third of a thickness of the top semiconductor layer.

16. The method according to claim 9, wherein the first conductivity type is P type and the second conductivity type is N type.

* * * * *